US010650899B2

(12) United States Patent
Alam

(10) Patent No.: US 10,650,899 B2
(45) Date of Patent: May 12, 2020

(54) DELAYED WRITE-BACK IN MEMORY WITH CALIBRATION SUPPORT

(71) Applicant: EVERSPIN TECHNOLOGIES, INC., Chandler, AZ (US)

(72) Inventor: Syed M. Alam, Austin, TX (US)

(73) Assignee: Everspin Technologies, Inc., Chandler, AZ (US)

(*) Notice: Subject to any disclaimer, the term of this patent is extended or adjusted under 35 U.S.C. 154(b) by 275 days.

(21) Appl. No.: 15/499,136

(22) Filed: Apr. 27, 2017

(65) Prior Publication Data
US 2018/0314635 A1 Nov. 1, 2018

(51) Int. Cl.
*G11C 16/22* (2006.01)
*G11C 11/4076* (2006.01)
(Continued)

(52) U.S. Cl.
CPC .......... *G11C 16/22* (2013.01); *G06F 12/0238* (2013.01); *G11C 11/4076* (2013.01);
(Continued)

(58) Field of Classification Search
CPC ...... G11C 16/22; G11C 11/4076–4078; G11C 29/52; G11C 11/1673–1675; G11C 2207/2254; G06F 3/0634
See application file for complete search history.

(56) References Cited

U.S. PATENT DOCUMENTS 6,330,636 B1    12/2001  Bondurant et al.
6,374,337 B1 *  4/2002   Estakhri .......... G11C 8/00
                                                365/189.05
(Continued)

FOREIGN PATENT DOCUMENTS

EP    2814035 A1    12/2014
WO    0030116 A1    5/2000

OTHER PUBLICATIONS

JEDEC Solid State Technology Association, "JEDEC Standard: DDR3 SDRAM Specifcation", 2007, JEDEC, Sep. 2007, pp. i-167 (Year: 2007).*
(Continued)

*Primary Examiner* — Reginald G Bragdon
*Assistant Examiner* — Curtis James Kortman
(74) *Attorney, Agent, or Firm* — Bookoff McAndrews, PLLC

(57) ABSTRACT

A memory having a delayed write-back to the array of data corresponding to a previously opened page allows delays associated with write-back operations to be avoided. After an initial activation opens a first page and the read/write operations for that page are complete, write-back of the open page to the array of memory cells is delayed until after completion of a subsequent activate operation that opens a new page. Techniques to force a write-back in the absence of another activate operation are also disclosed. Calibration and testing sequences are also supported in which a non-destructive mode preserves data stored in a non-volatile memory array and status bits used to indicate open pages are cleared so later inadvertent delayed write-back operations as a result of the calibration or testing do not corrupt the non-volatile data.

17 Claims, 9 Drawing Sheets

(51) Int. Cl.
  *G11C 29/52*  (2006.01)
  *G11C 11/4078*  (2006.01)
  *G06F 12/02*  (2006.01)
(52) U.S. Cl.
  CPC .......... *G11C 11/4078* (2013.01); *G11C 29/52* (2013.01); *G11C 2207/2254* (2013.01)

(56) References Cited

U.S. PATENT DOCUMENTS

| | | | | |
|---|---|---|---|---|
| 2003/0189870 A1* | 10/2003 | Wilcox | .................... | G11C 7/22 |
| | | | | 365/189.18 |
| 2005/0257120 A1 | 11/2005 | Gorobets et al. | | |
| 2008/0247260 A1* | 10/2008 | Song | ........................ | G11C 8/12 |
| | | | | 365/230.03 |
| 2014/0068154 A1* | 3/2014 | Hoya | .................... | G06F 3/0688 |
| | | | | 711/103 |
| 2015/0029786 A1* | 1/2015 | Andre | ................. | G11C 11/1673 |
| | | | | 365/158 |
| 2015/0055406 A1* | 2/2015 | Andre | ................. | G11C 11/1673 |
| | | | | 365/158 |
| 2015/0089267 A1* | 3/2015 | Nomura | ............. | G06F 13/1694 |
| | | | | 713/324 |

OTHER PUBLICATIONS

International Search Report and Written Opinion of the International Searching Authority from corresponding International PCT Application No. PCT/US2018/028250, dated Jul. 6, 2018 (13 pages).
International Search Report and Written Opinion issued in International Application No. PCT/US2017/015637, dated Apr. 11, 2017 (13 pages).

* cited by examiner

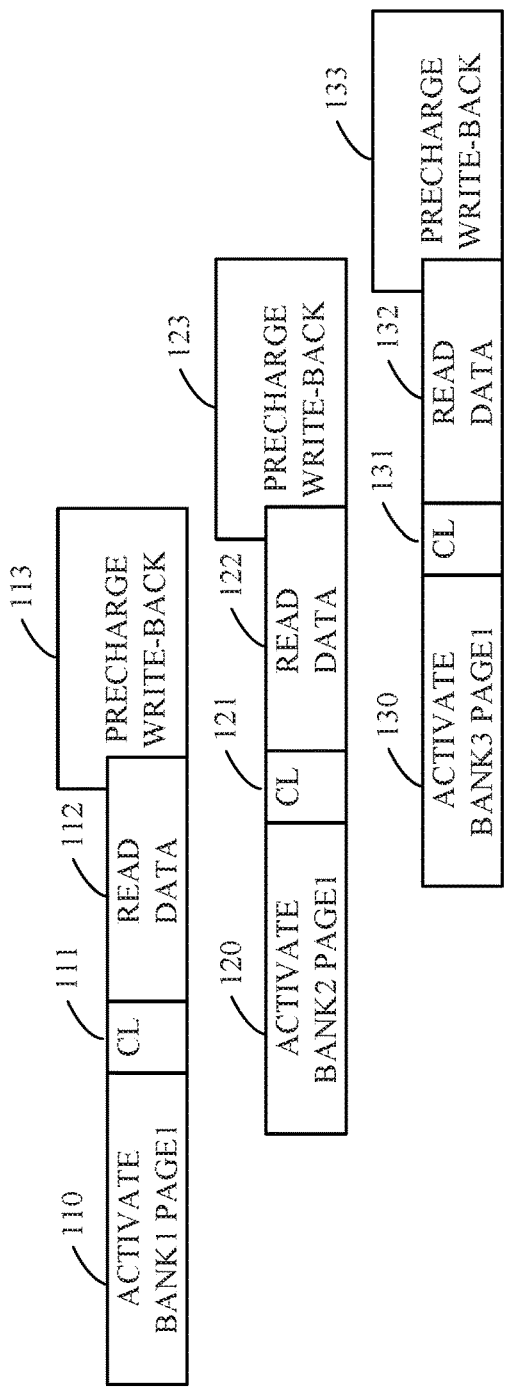
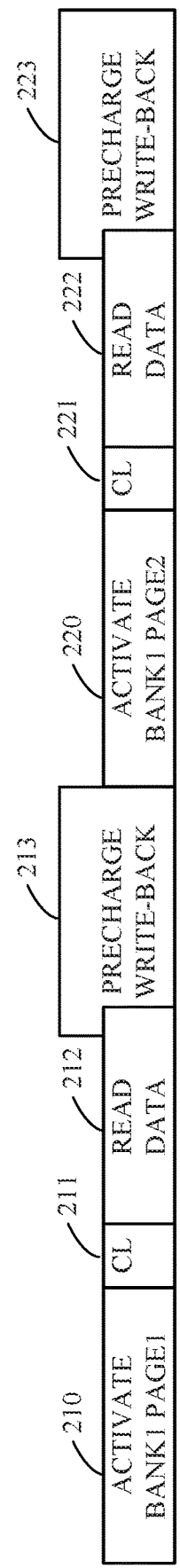
FIG. 1 (PRIOR ART)
FIG. 2 (PRIOR ART)

DELAYED WRITE-BACK IN MEMORY WITH CALIBRATION SUPPORT

TECHNICAL FIELD

The disclosure herein relates generally to memory devices having a delayed write-back to the array, and, more particularly, to circuits and methods for supporting such delayed write-back operations in memory devices in which calibration procedures are used.

BACKGROUND

Spin-torque magnetic memory devices store information by controlling the resistance across a magnetic tunnel junction (MTJ) such that a read current through the magnetic tunnel junction results in a voltage drop having a magnitude that is based on the state of the magnetoresistive stack. The resistance in each magnetic tunnel junction can be varied based on the relative magnetic states of the magnetoresistive layers within the magnetoresistive stack. In such memory devices, there is typically a portion of magnetoresistive stack that has a fixed magnetic state and another portion that has a free magnetic state that is controlled to be either of two possible states relative to the portion having the fixed magnetic state. Because the resistance through the magnetic tunnel junction changes based on the orientation of the free portion relative to the fixed portion, information can be stored by setting the orientation of the free portion. The information is later retrieved by sensing the orientation of the free portion. Such magnetic memory devices are well known in the art.

Some magnetoresistive memory devices such as magnetic random access memory (MRAM) support access protocols that are also used by other memory devices. For example, dynamic random access memory (DRAM) devices that use the synchronous double data rate protocol (e.g. DDR SDRAM, DDR2 SDRAM, DDR3 SDRAM, DDR4 SDRAM, etc.) are well known in the art. Some MRAM devices support such protocols, where the same operation codes for DDR SDRAM devices result in the same or similar operations in MRAM devices.

BRIEF DESCRIPTION OF THE DRAWINGS

FIGS. 1 and 2 are block diagrams showing relative timing of various aspects of data access operations in a prior art memory device;

DETAILED DESCRIPTION

Figure 3:
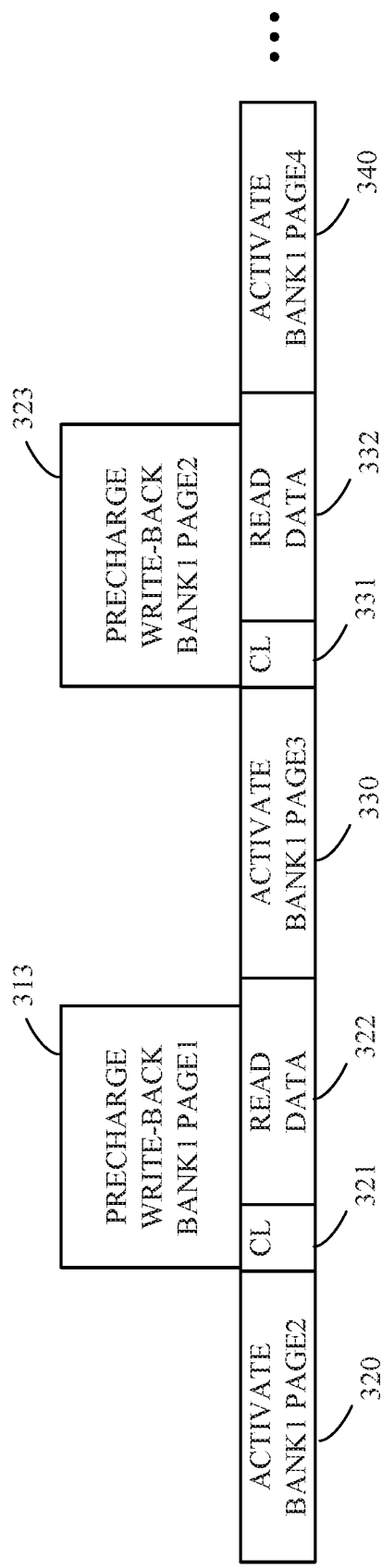
FIG. 3 is a block diagram showing relative timing of various aspects of data access operations in a memory device in accordance with an exemplary embodiment.

The following detailed description is merely illustrative in nature and is not intended to limit the embodiments of the subject matter or the application and uses of such embodiments. Any implementation described herein as exemplary is not necessarily to be construed as preferred or advantageous over other implementations.

For simplicity and clarity of illustration, the figures depict the general structure and/or manner of construction of the various embodiments. Descriptions and details of well-known features and techniques may be omitted to avoid unnecessarily obscuring other features. Elements in the figures are not necessarily drawn to scale: the dimensions of some features may be exaggerated relative to other elements to assist improved understanding of the example embodiments.

The terms "comprise," "include," "have" and any variations thereof are used synonymously to denote non-exclusive inclusion. The term "exemplary" is used in the sense of "example," rather than "ideal."

In the interest of conciseness, conventional techniques, structures, and principles known by those skilled in the art may not be described herein, including, for example, standard magnetic random access memory (MRAM) process techniques, generation of bias voltages, fundamental principles of magnetism, and basic operational principles of memory devices.

During the course of this description, like numbers may be used to identify like elements according to the different figures that illustrate the various exemplary embodiments.

For the sake of brevity, conventional techniques related to reading and writing memory, and other functional aspects of certain systems and subsystems (and the individual operating components thereof) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

Magnetic memory devices and other memory devices often include an array of memory cells divided into a plurality of banks or subarrays. In such memory devices, each bank can be accessed separately such that accesses between banks can be interleaved to optimize data throughput. Some magnetic memory devices support DDR memory protocols, where an activate operation opens a page of memory cells in a particular bank. A "page" of memory cells is understood to be a grouping of memory cells that are accessed together as a unit. In some instances, a "page" may constitute a "row" of memory cells. Opening a page moves the data for the page from the array of memory cells into a cache or other form of temporary storage where the data is more readily accessed. Once the page is activated (opened), read and write operations to the page can be performed. Upon completion of the read/write operations for the open page, the page is closed. When a page is closed, the array is returned to a state ready for a subsequent page activation, and the data in the closed page cannot be accessed again for reads and writes without re-opening the page. In some memory devices, data moved to temporary storage during the activate command is immediately written back to the array, and, in some cases, data corresponding to write operations performed while the page is opened is also immediately written to the memory cells in the array. In such memory devices, a precharge operation may only precharge the bit lines and de-assert the word line corresponding to the page. In other memory devices, data moved to temporary storage during an activate and data written to the open page is not stored into the array until just prior to closing the page. As such, in those memory devices, the precharge operation would also include performing the write-back of data from temporary storage to the array. By waiting until just prior to closing the page to write the data back to the array, a memory device can save power or improve timing specifications associated with the moving or modifying of the data.

Having multiple banks allows for multiple pages to be open, thereby enabling interleaving of accesses. This is because each bank has a corresponding cache or its own temporary storage that allows for separate reading and writing. FIG. 1 shows the interleaving of a plurality of memory reads corresponding to three different pages in three different banks. Each block represents the time consumed by the particular operation with respect to the other ongoing operations. The top row of blocks represents a read access to BANK1 PAGE1. At 110, the activate operation for BANK1 is occurring. During the activate operation, data corresponding to PAGE1 is retrieved from the portion of the array corresponding to BANK1 and stored in a cache for read/write access. As discussed in more detail below, the activate operation can be very time consuming, especially in magnetoresistive memory devices that use a self-referenced read operation to sense the data stored in the array.

After activation, a read request requires a read access time to fetch the particular data to be output. This corresponds to block 111, which is labeled CL for "CAS latency." CAS latency is a term commonly used to represent the time between receipt of a read request and the output of data corresponding to the read request. That time corresponds to the selection of the particular data in the open page and routing of that data to the outputs of the memory device. Read data is output during block 112. Notably, only a single read access for BANK1 PAGE1 is shown, but it is understood that many read and write accesses can occur while the page is open. In the prior art memory devices related to FIGS. 1 and 2, when all the accesses to the page are complete, a precharge command causes the page to be closed and data in the cache to be written back to the array at block 113. Such a write-back operation to the array can also be very time consuming relative to the time required to perform read and write operations while the data is in the cache.

As shown in FIG. 1, in order to "hide" some of the delay associated with the various operations, multiple pages can be opened in multiple banks. This allows the various signal lines used to convey commands, addresses, and data to and from the memory device to be used most efficiently. For example, once the activate command for BANK1 has been received by the memory, a second activate command corresponding to BANK2 can be sent. Because BANK2 has its own cache, activation of a separate page in BANK2 allows PAGE1 of BANK1 to be open at the same time as PAGE1 of BANK2. The second row of blocks in FIG. 1 shows that the time for activation of BANK2 PAGE1 at block 120 overlaps with portions 110-112 of the activation and read in BANK1. The read operation in BANK2 is similar to that in BANK1 in terms of timing, and is shown to include read access time 121, read data output 122, and precharge block 123. The third row of FIG. 1 shows similar operations 130-133 for BANK3.

As shown in FIG. 1, because the sequential accesses are in different banks (e.g. first a read from BANK1, then BANK2, and then BANK3), interleaving of the accesses allows read data can be output by the memory device relatively constantly. The read data 112 for BANK1 is immediately followed by the read data 122 for BANK2, which in turn is followed by the read data 132 for BANK3. Because the interleaving between banks allows delays associated with activation, read access time, and precharging to be hidden at least to some degree, high throughput can be achieved.

However, as shown in FIG. 2, in some instances sequential accesses may be to a different page in the same bank. In the example shown, BANK1 PAGE1 is activated at block 210, and after read access time 211, read data 212 is output. If the next access is a read to BANK1 PAGE2, then PAGE1 of BANK1 must be closed via precharge 213 before PAGE2 of BANK1 can be opened via activate 220. Following the activate 220, read data 222 is not output until after read access time 221. Precharge 223 then closes PAGE2 of BANK1. As is apparent from FIG. 2, such back-to-back accesses to the same bank do not allow the time associated with the activate, read access time, and the precharge to be fully hidden. It may be possible to begin the precharge operation as the last of the read data is output (i.e. slightly before the completion of the read data block 212), but, as is shown, the time delay between read data output 212 from the first page and the read data output 222 from the second page is significant.

In current dynamic random access memories (DRAM), the timing associated with activate and precharge operations is not much greater than that of other aspects of the data access cycle, and therefore the delay of a back-to-back operation such as that illustrated in FIG. 2 may be tolerable. However, in MRAMs, activate and write-back operations often take much longer, thereby resulting in a greater undesirable delay between data accesses for such same-bank sequential accesses.

In some MRAMs, a self-referenced read operation is used to sense the data stored in the array for a page to be accessed. In an example self-referenced read, the initial resistance through each of the memory cells in the page is sensed, then all of the memory cells in the page are written to a known state, and finally, the post-writing resistance through each of the cells is sensed again and compared with the initial resistance sensed before writing. Whether or not the resistance is the same after writing to the known state indicates the initial state of the memory cell. Notably, the self-referenced read is destructive, and leaves all of the memory cells in the known state written between the two sensing operations. Such a self-referenced read operation often takes a significant amount of time relative to other aspects of memory accesses. For example, activating a page in an MRAM may require on the order of hundreds of nanoseconds, whereas a read operation to an open page may be on the order of tens of nanoseconds.

Similarly, the time required to write-back a page of data to the array upon completion of read/write accesses can be significant. For example, in order to extend the life of the MRAM device, large magnitude write current pulses that can quickly change the state of the free layer in a spin-torque memory cell are typically avoided as such large pulses can damage the sensitive layers in the magnetoresistive stack. In order to avoid breakdown of the layers, write pulses of a lower magnitude and longer duration are often employed as they enable the free layer to be switched with less adverse effects on the device layers. While promoting longer life for the memory devices, such long-duration write pulses extend the time needed for write-back operations.

Embodiments disclosed herein utilize a delayed write-back of closed-page data to help improve overall throughput in magnetoresistive memory devices. This is accomplished by delaying the write-back of the data corresponding to a page that is being closed until a time at which the performance of the write-back does not adversely affect the timing of other ongoing operations associated with reads and writes. As disclosed herein, in some embodiments the write-back corresponding to a previously open page is performed following the activate operation for the next page to be accessed. In some embodiments, supporting such a delayed write-back in memory can require additional circuitry or techniques to allow other memory support functionality to be implemented. For example, some memory protocols use calibration sequences on startup in order to optimize timing associated with signaling between the memory and other integrated circuits, such as, for example, a memory controller. As discussed further below, supporting such calibration operations in the context of a memory that includes delayed write-back operations can benefit from additional circuits and techniques that ensure such calibration operations do not negatively impact the non-volatile nature of data stored on such memory devices.

FIG. 3 aids in illustrating the delayed write-back concept. As shown in FIG. 3, at block 320 an activate for BANK1 PAGE2 occurs. Following the read access time 321, read data 322 is output. Once the activate operation corresponding to BANK1 PAGE2 is complete and the PAGE2 data has been transferred from the array to the cache used for read and write operations, BANK1 in the array is no longer active. As such, the write-back operation corresponding to the previously opened bank can be performed during the time read and write operations for the newly activated bank occur. As shown in FIG. 3, the write-back operation for BANK1 PAGE1 at block 313 occurs once the activate operation 320 for BANK1 PAGE2 has completed. While FIG. 3 labels block 313 as "PRECHARGE WRITE-BACK BANK1 PAGE1," it should be appreciated that the write-back operations performed in block 313 are, in some cases, not the result of a precharge command received by the memory. In some embodiments, the indication that the read/write operations to a page are complete is based on receipt of a precharge command by the memory device. In other embodiments, the write-back of data occurs in response to a subsequent activate operation for the same bank. As discussed in additional detail below, additional commands or signals are used in some embodiments to cause write-back operations such as that shown in block 313.

As discussed above, write-back operations for a bank that is being closed typically occur as soon as the read and write accesses to that bank are complete, and such a write-back operation is typically prompted by a precharge command received by the memory device. As discussed herein, rather than performing the write-back immediately upon completion of the read and write accesses, thereby preventing a subsequent activate operation from fetching data from the array until after that write-back operation is complete, embodiments disclosed herein delay that write-back operation until a time at which the write-back can be hidden and not impact timing of the subsequent activate operation. Because the write-back for the previously open page is writing data corresponding to a closed page to the array, no adverse delays are caused by shifting the write-back operation such that it occurs after the next page has been opened. In other words, there is no rush to put the data back into the array as another, different page is currently being accessed.

As illustrated in FIG. 3, by delaying the write-back corresponding to the previously open page within a bank until after the next activate operation for that bank is complete, the precharge time associated with that bank can be hidden, thereby greatly improving the latency and throughput characteristics for the memory device. Indeed, as is shown in FIG. 3, the memory can be reading and writing data (e.g. block 322) while the write-back for the previously opened page in that bank is occurring. In FIG. 3, the initial state of the memory device corresponds to a point in time where BANK1 PAGE1 was previously opened, but the read and write operations corresponding to that page have been completed, and the PAGE1 data is ready to write back to the array. With PAGE1 data ready to write-back, the activate command corresponding to BANK1 PAGE2 is received, thereby indicating that PAGE2 is to be opened for read and write accesses. Instead of completing that write-back operation for PAGE1 prior to activation of PAGE2, PAGE2 is opened first, and, once that activation is complete, the write-back operation for PAGE1 can occur without delaying any of the operations associated with activating PAGE2 or accessing data in newly-open PAGE2 (e.g. read access time 321 and read data 322). This provides a significant timing advantage in comparison to systems in which such a delayed write-back is not employed.

Following accesses to BANK1 PAGE2, the activate operation for PAGE3 of BANK1 occurs at block 330. Immediately upon completion of the activate for PAGE3, the write-back for BANK1 PAGE2 can occur at block 323 while the read access time 331 and read data 332 for PAGE3 are simultaneously occurring. Similarly, the write-back for PAGE3 begins once the activate for BANK1 PAGE4 completes at block 340. Notably, the write-back operation for the previously open page can occur as soon as all of the portions of the next activate command that would prevent the write-back from occurring are complete. For example, while some portions of the write-back and activate utilize the same circuitry on the memory device (e.g. write drivers, column decoders, etc.), other portions may use independent circuitry such that some aspects of the activate operation are not complete when the write-back operation begins.

Embodiments described herein use the time after an activate operation, when reads and writes to the newly opened page are occurring, to write-back the data corresponding to the previously open page to the array. In order to accomplish this, the data corresponding to the previously open page must be stored in a location that will not interfere with the activation of the new page to be accessed. In some embodiments, each bank of the memory device includes two cache structures, where a first cache serves as the primary, or active cache for read/write operations to the open page and a second cache serves as a temporary storage location for data corresponding to the page for which accesses are complete but write-back has not yet occurred.

Figure 4:
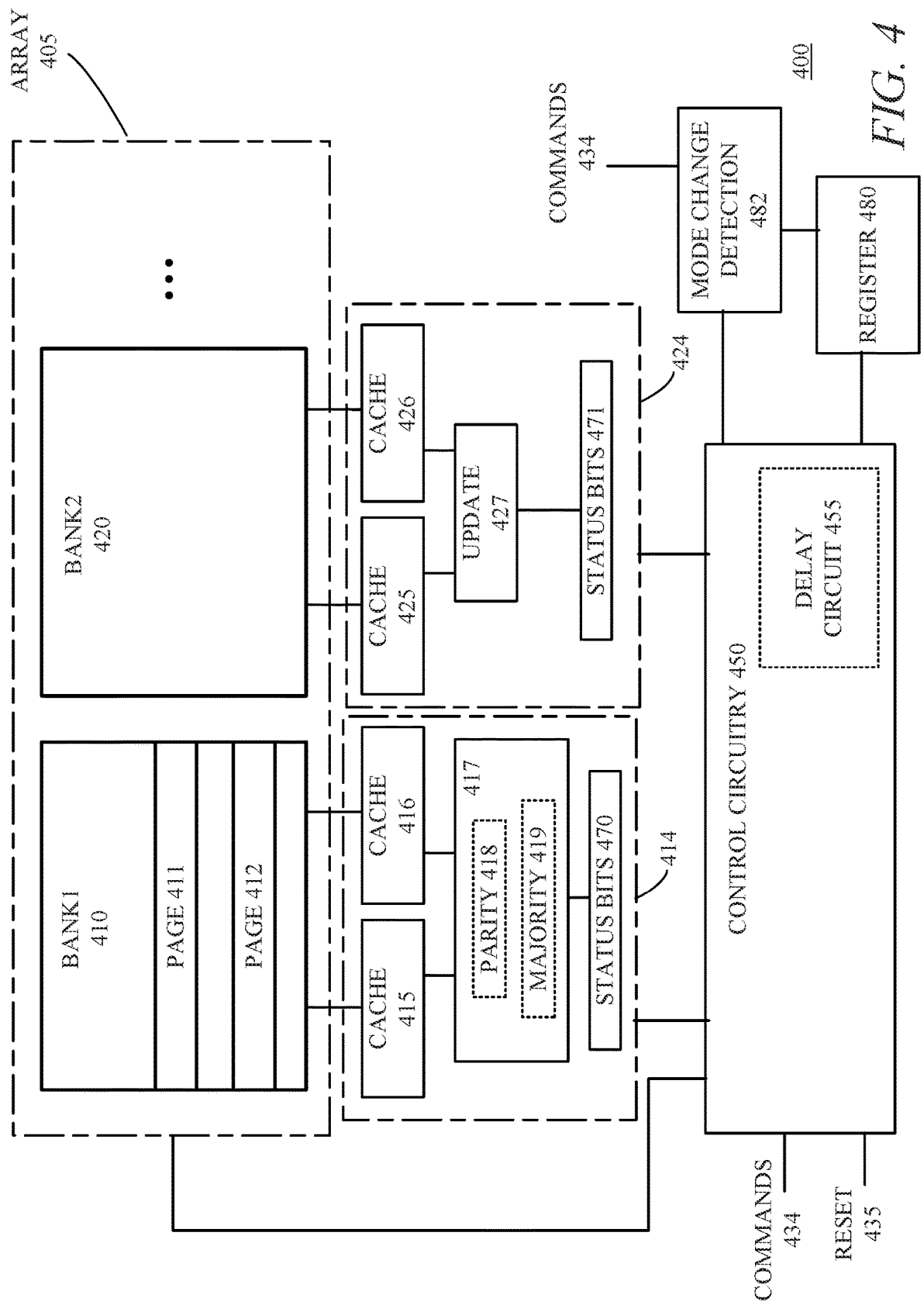
FIG. 4 is a schematic diagram of a portion of a magnetic memory device in accordance with an exemplary embodiment.

Turning to FIG. 4, a schematic diagram of a portion of a memory device 400 in accordance with various embodiments is presented. Memory device 400 includes an array 405 of memory cells. In some embodiments, the memory cells are non-volatile spin-torque MRAM cells, whereas in other embodiments, the memory cells are other types of memory cells such as, for example, DRAM cells or other resistive memory cells. As shown in FIG. 4, array 405 includes a plurality of banks, including BANK1 410 and BANK2 420. Each of banks 410 and 420 includes a corresponding set of circuitry 414 and 424, respectively, used to temporarily store data for read and write accesses for pages within the banks 410 and 420. Circuitry 414 for BANK1 410 includes a first cache 415, a second cache 416, and update circuitry 417. The update circuitry 417, which may include parity calculator 418 and/or majority detection circuit 419 is discussed in additional detail below.

As shown in FIG. 4, caches 415 and 416 are coupled to BANK1 410 to allow data to be transferred between BANK1 410 of the array 405 and caches 415 and 416. In some embodiments, each of the caches 415 and 416 includes static random access memory (SRAM) memory cells, whereas in other embodiments, the caches 415 and 416 are made up of registers, flip-flops, or other storage circuits that are used to store data. Caches 415 and 416 include enough storage to accommodate a page of data from BANK1 and may also include additional storage to store the address of the page, parity or other error correction code (ECC) information for the page, and any inversion or other information relevant to the page. In some example embodiments, the caches 415 and 416 are on the order of 64 data words at 8 or 16 bits/word. In other example embodiments, the caches store 128 or 256 words. In some embodiments, banks are combined to maintain the number of data words stored when the word size increases, for example, from 8 to 16 bits. The size of the caches and that of the pages accessed can be adapted to suit the needs of the application.

As illustrated in FIG. 4, each bank in the array 405 has a corresponding set of caches and update circuitry. BANK2 420 is shown to be coupled to caches 425 and 426 with update circuitry 427. Having separate cache structures for each bank enables multiple pages in different banks to be open simultaneously, thereby allowing for interleaved accesses. While the embodiment depicted in FIG. 4 shows two caches for every bank, in other embodiments, more than two caches are included for each bank, thereby allowing the write-back for more than one page to be deferred until a later point in time. Such additional caches may be appropriate in embodiments where the time required for a write-back is much longer than that needed for activate operations or where the access pattern would benefit from deferment of write-back for multiple pages. In yet other embodiments, each bank has one corresponding cache for storage of the open page for read/write operations, but shares a second cache with one or more other banks, where the second cache is used exclusively for storing data corresponding to a closed page that has not yet been written back. Note that sharing a write-back cache between banks could limit activate operations to those banks to ensure that conflicts do not occur where both banks require the use of write-back cache at the same time.

Control circuitry 450 is coupled to array 405 and circuitry 414 that includes the caches 415 and 416 as well as the update circuitry 417. In the embodiment shown in FIG. 4, control circuitry 450 is coupled to all of the banks in the array 405 and all of the cache structures and update circuitry for those banks. As such, control circuitry 450 provides global control over memory access operations in the embodiment of FIG. 4. In other embodiments, dedicated control circuitry is provided for each bank such that the operations for each bank are individually controlled.

Control circuitry 450, which may include, for example, a state machine, processor, microcontroller, or logic circuitry is configured to control the movement of data, and operations performed on the data, for the various memory access operations supported by the memory device. Control circuitry 450 receives commands 434 and a reset signal 435. In other embodiments, control circuitry 450 receives additional signals, either sourced internal to the memory device or external from the memory device, that provide the control circuitry 450 with information or instructions to facilitate the data storage and retrieval operations. For example, control circuitry 450 may receive a self-refresh signal that indicates that no immediate accesses are impending and the memory device has an opportunity to perform other operations while such a signal is asserted. The commands 434 received by the control circuitry 450 can include commands received from an external memory controller or other control device that issues commands to the memory device. For example, an external memory controller can provide commands 434 to the control circuitry 450 where such commands include activate, read, write, precharge, read with autoprecharge, write with autoprecharge, and refresh commands. In other embodiments, the commands directing the actions of the memory device may be processed in a hierarchical manner such that some shared circuitry performs some of the actions related to each command, and the control circuitry 450 receives more localized commands 434 that are derived from higher-level commands received by the memory device.

In operation, the control circuitry 450 is configured to, in response to a first activate command received by the memory device, transfer first page data from a first location in the array to a first cache. In an example corresponding to the FIG. 4, the first activate command causes the control circuitry 450 to provide the appropriate signals to the array 405 and cache 415 such that the data corresponding to FIRST PAGE 411 in BANK1 410 is transferred into the cache 415. In some embodiments, loading the data for FIRST PAGE 411 into cache 415 includes performing a self-referenced read for the memory cells included in FIRST PAGE 411. In other embodiments, referenced read operations (e.g. where the resistance of each memory cell is compared with a reference to determine the data stored therein), or other techniques for ascertaining the data stored in each memory cell are used to load the data for FIRST PAGE 411 into cache 415.

Once the data for FIRST PAGE 411 is loaded into cache 415, FIRST PAGE 411 is considered to be "open," and read and write operations to FIRST PAGE 411 can occur by reading the data in the cache 415 or overwriting data in the cache 415. Each read or write command is accompanied by address information that allows specific words or sets of words in FIRST PAGE 411 to be accessed. Once all of the read and write accesses to FIRST PAGE 411 are complete, the data for FIRST PAGE 411, which may include new data added by write operations, is moved from the cache 415 to the cache 416. In some embodiments, the indication that the read/write operations to FIRST PAGE 411 are complete is based on receipt of a precharge command by the memory device. In other embodiments, data is retained in the cache 415, which may be referred to as the primary cache, until a subsequent activate operation for BANK1 410 is received by the memory device. As discussed in additional detail below, additional commands or signals are used in some embodiments to cause the data in cache 415 to be moved either into cache 416 or directly back into BANK1 of array 405.

After transferring the first page data from the first cache 415 to the second cache 416, first cache 415 is available to receive data corresponding to a new page. Thus, in response to a second activate command corresponding to SECOND PAGE 412 of BANK1 410, the control circuitry 450 issues the appropriate control signals such that second page data corresponding to SECOND PAGE 412 is transferred from the location corresponding to SECOND PAGE 412 in BANK1 410 of the array 405 into the cache 415. SECOND PAGE 412 is thereby "opened" and available for read and write operations. Once the activate operation for SECOND PAGE 412 is complete, or has progressed far enough so as to not interfere with a write-back operation to BANK1, the first page data corresponding to FIRST PAGE 411 that is stored in cache 416 can be written back to the appropriate location in BANK1 of the array 405. As noted above, the address for FIRST PAGE 411 can be included with the data stored in the cache 416 so the location to which the first page data is to be written in the array 405 is known. In other embodiments, a separate register or storage location can be used to store the address information for each page along with any other appropriate page-specific information such as parity information or inversion status.

Parity information or other forms of ECC are used in some embodiments to prevent or reduce data errors. Parity calculation is well known in the art, and storing a set of parity bits for a page in the bank with the page data allows for parity checking to confirm data validity and may allow for correction of data errors in some instances. In the example described above with respect to FIG. 4, when the first page data corresponding to FIRST PAGE 411 is written back into the array 405, that data may include parity information. Because the data included in FIRST PAGE 411 may be modified by write operations that are performed while the FIRST PAGE 411 is open, new parity calculations need to be performed before the data is written back to the array 405. In some embodiments, the parity calculations are performed as each write operation to the page are completed such that the parity information stored with the data in cache 415 is always current. In such embodiments, the accurate parity information can be shifted with the data from cache 415 to cache 416 prior to writing back at a later time. However, performing such parity calculations in real-time can be costly in terms of time and resources (e.g. extra power consumption would be required). As such, because it is known that no further write operations to FIRST PAGE 411 will occur when the data for FIRST PAGE 411 is moved to the cache 416, the parity calculations for FIRST PAGE 411 can be performed in conjunction with the moving of the data from cache 415 to cache 416. In FIG. 4, parity calculator 418 is included in update circuitry 417, where the parity information is updated when the data is transferred from cache 415 to cache 416.

Because destructive self-referenced read operations that write all of the memory cells in a selected page to a first state leave all the cells in the same state at the conclusion of an activate operation, determining whether the majority of the bits in the page are in the first state (e.g. binary "0") or in the second state (e.g. binary "1") before the page is written back can help reduce power consumption. For example, if the activate operation leaves all the memory cells in the page in the first state corresponding to a binary "0," and, when the data is ready to be written back, the majority of the bits in the page to be written back are a "0," then less than half of the memory cells will require the one or more write pulses that are used to change the free layer in those cells to the state corresponding to a binary "1." If, however, the majority of the bits in the page are "1's," then more than half of the memory cells will have to be written to in order to change their state. In such an instance, it is valuable to invert all of the bits for the page such that the state that formerly represented a "0" now represents a "1." By inverting all of the bits when the majority does not correspond to the state the memory cells are left in when the activate is complete, the write back will always involve writing to no more than half of the memory cells in the page.

In order to support such inversion after a majority detection, an inversion status bit is maintained for each page to indicate if the data stored in the array 405 for that page is inverted or not. In addition, a majority detection needs to occur for each page prior to write-back of the page if data in the page was modified while the page was open. As such, majority detector 419 is included in the update circuitry 417. As was the case for the parity calculation, majority detection can be performed in real time with each write operation, but it is likely more efficient to perform the majority detection and setting of the inversion bit once the page is in the process of closing. Thus, in some embodiments, majority detection is performed when the data for a page is transferred from the first cache 415 to the second cache 416.

In order to facilitate all of the internal operations associated with moving the data between the various locations and performing the steps associated with parity calculation, majority detection, etc., the control circuitry 450 generates a plurality of timing signals that direct the circuitry on the memory device so that the proper operations are performed in the proper order and at the proper time. In some embodiments, those timing signals are generated by delay circuit 455, which is shown to be included in control circuitry 450. In some embodiments, the delay circuit includes a plurality of delay blocks or circuits that are used to generate the timing signals associated with the various functions that occur in accessing data in the memory array 405. For example, in response to an activate operation for BANK1 in the situation where a previous page in BANK 1 has not yet been written back, a plurality of timing signals are generated such that the data from cache 415 is moved to cache 416, any parity calculation and majority detection is performed, the page to be opened is loaded into the cache 415, and, once the activate is complete, the data in cache 416 is written back to the array 405. Thus a single transition of a signal indicating an activate may trigger multiple signal transitions appropriately spaced in time by the delay circuit 455 so that the appropriate operations occur at the appropriate time. The spacing between various timing signals may be programmable such that the relative time at which different operations are performed can be adjusted by, for example, storing values in a programmable register.

Note that in some instances, sequential activates can be received that correspond to the same page in the same bank. For example, FIRST PAGE 411 may be opened, a number of read/write operations to the data in FIRST PAGE 411 performed, and then a precharge command received indicating that FIRST PAGE 411 should be closed. In some embodiments, receipt of the precharge command does not result in the data being written back to the array as the control circuitry 450 is waiting for the next activate command to do so. As such, if a new activate operation is received corresponding to FIRST PAGE 411 directing the memory to re-open it, transferring data from the array 405 to cache 415 will not result in the data for FIRST PAGE 411 being placed in cache 415 as the data for FIRST PAGE 411 is not yet back in BANK1 410 of the array 405. In some embodiments, the data for FIRST PAGE 411 is still in the cache 415 when the re-activation command for FIRST PAGE 411 is received. As such, in some embodiments, control circuitry 450 includes a page address comparator that is configured to compare the address accompanying an activate command with the address of the last page opened. If the comparison indicates that the new page to be opened is the same as the previous page, the control circuitry 450 will do nothing if the data for the previously opened page is still in the primary cache 415. If the new page to be opened is the same as the previous page and the data for that page has already been transferred to cache 416, the data can be either be transferred directly back to cache 415 or written back to the array 405 before the data is retrieved once again from the array and loaded into cache 415.

Another potential issue with the delayed write-back of the previous page occurs when the previous page of data is not written back in response to a precharge command, but instead is waiting for another activate command that never comes. For example, the final data accesses to a bank before power is turned off may result in the data for the accessed page residing in the cache 415 or 416 awaiting the next activate. Without such an activate, the write-back to the array 405 would not normally be initiated. As such, power-down may occur with the data not yet written back to the array 405. If the cache structures are volatile storage, the data can be lost.

In some embodiments, this issue is addressed by using non-volatile storage for one or both of the caches for each bank. In other embodiments, the memory device can periodically perform a write-back to the array at a time when no new activate command will be received. In some embodiments, a refresh command or refresh signal received by the memory device indicates that the memory controller will not be issuing an activate any time soon, and the memory has the chance to perform a "refresh" operation. Such refresh operations are used in DRAMs to replenish charge on capacitors in one or more of the rows in the array of memory cells. In order to perform the refresh, all banks in the DRAM are typically closed. As such, even though MRAM does not need to perform refresh operations, it can take the refresh command or signal as an indication that all banks should be closed and the data corresponding to pages currently held in the caches should be written back to the array. In other embodiments, the refresh command/signal can be used to initiate a write-back to one of many banks, where the memory device keeps track of which banks have been written-back, thereby knowing in which bank the next refresh will trigger a write-back.

In other embodiments, the reset signal 435 can be used as a trigger to initiate write-backs to the array. By specifying to users that the reset signal needs to be asserted in order to ensure the data in the memory is non-volatile, users can assert the reset signal before events such as a power down, thereby causing the data for the last opened page to be transferred from, for example, cache 415 to cache 416 (with possible parity and inversion calculations), and then written back into memory array 405.

In yet other embodiments, a new operation code can be employed to specifically cause a write-back to occur without the need for another activation. For example, a "STORE" operation code could be sent by the memory controller to the memory, where the STORE operation code causes the MRAM to write-back any rows that are awaiting write-back. Such a STORE operation code can either be bank-specific in that it only directs the data corresponding to one bank to be written back to the array (STORE-BANKx, where x=the bank number), it can cause the data for a subset of banks to be written back, or it can cause the data for all banks to be written back (STORE-ALL). Such a new operation code(s) can be used to clean up any volatile data on the memory device, forcing it to be stored in the non-volatile storage of the array 405 such that it is not susceptible to loss if power is removed.

When write-back operations to a large page (many bits per page) or multiple banks occurs, it may be desirable to stagger the write-back operations to subsets of the memory cells in order to reduce power and current spikes associated with the write-back operations. In such staggering, portions of the memory cells are written back to at different times such that the current draw and power consumption associated with the write back is distributed in time. Thus, a first portion of the data to be written back is written at a different time than a second portion of the data. For example, in a write-back to a large page, half of the bits in the page may be written back first, and then the other half of the bits written back later. In another example corresponding to a STORE-ALL command or operation code, the data for half of the banks is written back first and then the data for the other half of the banks is written back. In another STORE-ALL example, half of the bits in each of the banks is written back first, and then the other half of the bits in each bank are written back. In yet another STORE-ALL example, write-back operations are serialized such that a bank or a group of banks is waiting for the completion of write-back operation (s) in another bank or a groups of banks. Such staggering of write-back operations can be split into many phases, can be set to be programmed, and can be bank-specific, memory cell-specific, or both.

If the delay circuit 455 is used to generate the timing signals used to perform the write-back operations and such signals are delay-based signals generated in response to a trigger signal, the write-back operations can be accomplished without the need for a clock signal. This allows a system to issue an indication that write-back should occur (e.g. a refresh, self-refresh, reset, or STORE command) and then turn off the clock without concern for the data not being written back. When write-backs are staggered, the delay circuit can use feedback or daisy-chain multiple delay circuits to ensure that some write-back operations occur before others.

While the discussion above with respect to FIG. 4 describes transferring newly-activated pages to a primary cache 415 and the moving that data to secondary, write-back cache 416 prior to write back, in other embodiments, rather than moving the data between the caches, the roles of the caches can be changed. For example, a first activate can load a first page of data in to a first cache, while the second activate loads a second page of data into a second cache before writing the first page of data back into the array from the first cache. Reads and writes to the first page would occur using the first cache, and reads and write to the second page would use the second cache.

After all of the pages in a bank have been written-back to the array 405, the next activate operation should not result in a write back of data stored in cache 415. As such, a flag or one or more status bits 470 and 471 can be used for each bank to indicate whether the bank has a page that is open and/or awaiting write-back. Thus, when the device is first turned on, the flag is cleared or the status bits are updated, indicating that no pages are open and awaiting write-back. When the first page is opened, the flag or status bits 470 are set such that a subsequent activate will trigger a write-back of the first page data. If a STORE or other write-back indication is received, the data is written back and the flag or status bits 470 are cleared. In some embodiments, status registers already present in standard-compliant memory devices can be used to store such flags or status bits.

In some embodiments, the flags or status bits 470 associated with whether or not a bank is open or has data waiting to be written back can be manipulated to support testing, burn-in, or other operations that are designed to exercise the memory device in a manner that differs from normal operation. For example, some testing operations want to continuously access the same page within a bank without concern for the actual data stored therein. By keeping the open indication for that bank clear and not performing the comparison of the address for the page to be activated with the last page activated, the memory device can be exercised as desired rather than having it do nothing in response to an attempt to open a page that is already opened.

In yet other embodiments, start-up or configuration testing is performed in order to optimize the timing of certain signals received by or transmitted by the memory. For example, the data strobe (DQS) in the DDR SDRAM protocol is often calibrated for each memory in order to account for the time of flight for the signal from the memory controller to the memory. Such calibration uses a number of read/write operations to each memory in order to calibrate the data strobe. In the case of non-volatile memories, such as MRAMs, the data stored in the array of non-volatile memory cells is assumed to be stable after power is turned off. As such, if calibration procedures are performed when power is restored in order to optimize the timing of the data strobes or other signals, the read/write operations associated with such calibration can cause non-volatile data to be inadvertently overwritten. In some cases, this is because the calibration procedures were originally developed for volatile memory such as DRAM in which the data in the memory array is not expected to be valid or meaningful upon power-up. As such, in order to support the calibration procedures associated with interfaces such as the DDR SDRAM interface on memories that use the delayed write-back techniques described herein, additional steps can be taken in non-volatile memories such as MRAMs in order to ensure such calibration can occur without disturbing the non-volatile data stored in the array 405.

As described in U.S. Pat. No. 9,275,715, which issued Mar. 1, 2016, accesses to the memory array in such memories can be disabled during calibration or start-up operations such that the data stored in the non-volatile is left undisturbed. The contents of U.S. Pat. No. 9,275,715 are hereby incorporated by reference in their entirety. As described in U.S. Pat. No. 9,275,715, a non-destructive mode on the memory can be used to prevent reads from the array, writes to the array, or both reads and writes from and to the array. In some embodiments, the non-destructive mode is the default mode that it entered upon power up, whereas in other embodiments, the non-destructive mode is entered based on a value stored in one or more registers 480 on the memory in response to a command received by the memory. In some embodiments, an exit from the non-destructive mode can be accomplished by changing the value stored in the one or more registers. For example, the non-destructive mode can be entered by setting a bit in the register to a "1" and exited by clearing the bit to a "0." Thus, following calibration, testing, or other operations that utilize the non-destructive mode, the memory can transition to normal mode in which access to the array of non-volatile memory cells is enabled. In some embodiments, the transition from non-destructive mode to normal mode is based on a determination that the calibration, testing, or other operations is complete, which can be done internally by the memory or can be based on a signal received by the memory from a memory controller or other external source. Thus, in some embodiments, the memory can default to the non-destructive mode on power up and then exit the non-destructive mode automatically on completion of a calibration procedure.

When the memory is in the non-destructive mode, data stored in the non-volatile memory array is not disturbed. In the non-destructive mode, reads and writes to the memory that would normally result in data being stored in or retrieved from the array 405 can be performed using the cache structures or other storage on the memory that does not include non-volatile data that is expected to survive the calibration or testing being performed.

In embodiments that support such a scheme where memory accesses to the non-volatile array 405 are disabled during calibration or start-up, the flags or status-bits associated with the pages of memory in those arrays can be managed such that when the memory transitions from the non-destructive mode to the normal mode and access to the non-volatile array is enabled, the flags or status bits 470, 471 do not represent that a page that was allegedly accessed during calibration is open and such flags or status bits 470, 471 do not cause a write-back operation in which invalid data stored in one of the caches on the memory is used to overwrite the valid data in the array. Various embodiments supporting non-destructive modes together with delayed write back are discussed in more detail below.

In one embodiment, while the memory is in the non-destructive mode, the flags or status bits 470 used to indicate whether a page is open and thus will eventually need to be written back are disabled. As such, even if the memory receives an activate operation code or command while in the non-destructive mode, no data in the array 405 is overwritten or changed, and the status bits 470 that would indicate that the page of data for the active operation is open are not updated or set to such a state. Instead, the status bits 470 are left alone or changed to indicate that no write-backs are pending or needed. Thus, when the memory transitions from the non-destructive mode to the normal mode, a received activate, or other "trigger" command or indication that could cause a write-back from one of the caches 415, 416 to the array 405 will not result in any such write-back as the status bits 470 show that no pages are open when the memory enters the normal mode.

In other embodiments, the flags or status bits 470 are cleared when the memory transitions from the non-destructive mode to the normal mode. In some cases, this can be accomplished by mode change detection circuitry 482 on the memory device that detects the transition from the non-destructive mode to the normal mode and clears or resets the flags or status bits 470 when such a transition occurs. For example, if a bit in the register 480, which may be a mode register such as those commonly used in DDR-compatible memories, indicates whether the memory is in non-destructive mode or normal mode, a transition of that bit from the state indicating the memory is in non-destructive mode to the state indicating that the memory is in normal mode can be used to trigger the clearing or resetting of the flags or status bits to indicate that no open pages exist that need to be written back. In another example, a command received from external that indicates the memory is to transition from the non-destructive mode to the normal mode is detected and used as a basis for clearing or resetting the flags or status bits.

In yet other embodiments, the system that includes the memory can ensure that the flags or status bits 470 are reset or cleared prior to the memory transitioning from the non-destructive mode to the normal mode. For example, the memory controller or other entity that is controlling the calibration or testing can issue a command to the memory that instructs the memory to perform a write-back operation. As discussed herein, such commands can include refresh, self-refresh, precharge, reset or STORE commands, where after such commands are executed, the flags or status bits are in the reset or cleared state thereby indicating that no pages are open and no pages are needing to be written back. Notably, providing such a command while the memory is in the non-destructive mode does not impact the data stored in the array because such data is protected while the memory is in the non-destructive mode. In yet another embodiment, a dedicated command or sequence of signal transitions can be provided by the memory controller, where the dedicated command or sequence of signal transitions is received by the memory and where the memory clears or resets the flags or status bits in response.

FIGS. 5-7 and 9-10 are flow charts that illustrate exemplary embodiments or aspects of embodiments of methods for supporting a delayed write-back in memory devices. In one example, the memory devices include an array of spin-torque magnetic tunnel junction memory cells. The operations included in the flow charts may represent only a portion of the overall process used to operating the device. For illustrative purposes, the following description of the methods in FIGS. 5-7 and 9-10 may refer to elements mentioned above in connection with FIG. 4. It should be appreciated that method may include any number of additional or alternative tasks, the tasks shown in FIGS. 5-7 need not be performed in the illustrated order, and the methods may be incorporated into a more comprehensive procedure or process having additional functionality not described in detail herein. Moreover, one or more of the tasks shown in FIGS. 5-7 could be omitted from an embodiment as long as the intended overall functionality remains intact.

Figure 5:
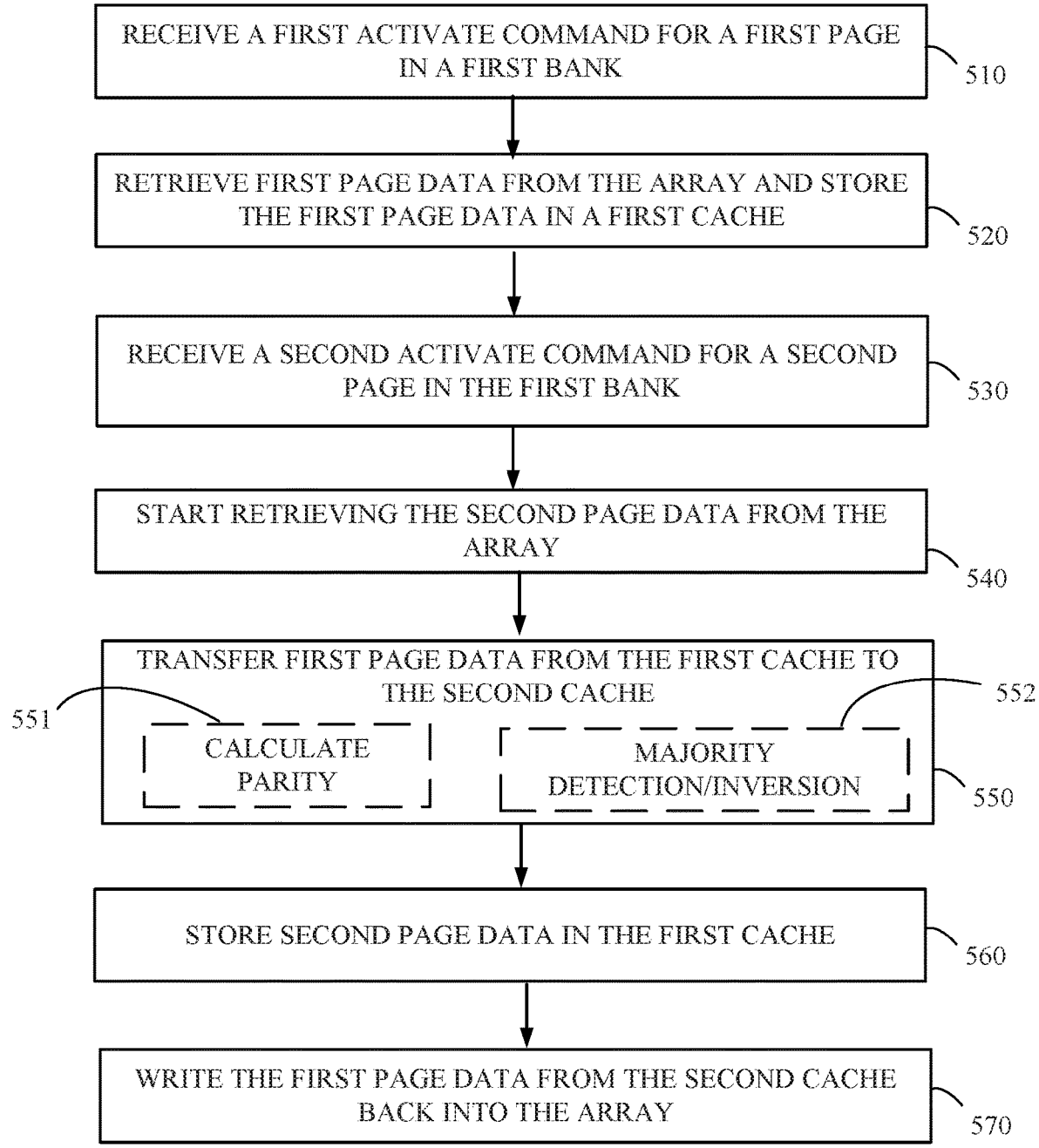
FIGS. 5-7 are flow charts corresponding to methods for performing and supporting delayed write-back in a magnetic memory in accordance with exemplary embodiments.

Turning to FIG. 5, at 510 a first activate command for a first page in a first bank of the memory device is received. At 520, in response to the first activate command, a first page of data is retrieved from the array and stored in a first cache on the memory device. Once the first page has been activated in this manner, read and write operations to the data in the first page can occur by accessing the first cache. In the DDR protocol, the first page would be typically be closed based on the receipt of a precharge command corresponding to the first page. Such a precharge command would be issued once the read/write operations for the first page are complete and prior to the receipt of the second activate command at 530. Notably, while such a precharge command may be issued in the system in which the memory resides and received by the memory, in some embodiments, the memory simply ignores the precharge command as write-back operations are no longer performed directly in response to such a precharge command.

At 530, a second activate command for a second page in the first bank is received. As discussed above with respect to FIG. 4, in order to move the data for the second activate command from the first bank of the array into the first cache for access, the data corresponding to the first page is moved to a second cache before eventually being written back into the array. However, by delaying the write-back of the data corresponding to the first page until after the activation for the second page is complete, the time associated with writing back the first page data can be hidden and will not delay any read or write operations directed at the second page.

At 540, in response to the second activate command, the memory starts retrieving the second page data from the array. At 550, the first page data is transferred from the first cache to the second cache. Notably, the transfer of the first page data can occur at the same time as the retrieval of the second page data is initiated as long as the first page data is out of the first cache before the second page data is stored there. While the flow diagram of FIG. 5 indicates that the second page data retrieval begins before the transfer of the first page data, the ordering of these steps is not critical as long as there is no conflict. In some embodiments, the transfer at 550 begins in response to the second activate command, whereas in other embodiments, the transfer is triggered by a precharge command corresponding to the first page received prior to the second activate command as discussed above. Thus, a precharge command may trigger the movement of the first page data from the first cache to the second cache, but the data may remain in the second cache until a subsequent activate command causes it to be written back.

Notably, in some embodiments, the precharge command is not used to trigger movement of the data from the first cache to the second cache. In such embodiments, the precharge command may serve no function such that the memory device does nothing in response to a precharge command. By eliminating the need for precharge commands, the timing associated with the provision of such precharge commands in standard protocols such as those used for DDR memory devices can be relaxed in ways that allow more flexibility to memory system designers.

Transferring the first page data from the first cache to the second cache at 550 can include performing parity calculation at 551 such that the appropriate parity, or other ECC information, is available at the time the first page data is to be written back into the array. Similarly, majority detection and inversion at 552 can be included as part of the data transfer from the first cache to the second cache. Performing parity calculation and majority detection at this point in time makes sense as any writes to the first page complete, and thus the data being transferred is final with respect to parity and inversion determinations related to storage of the data in the array. While parity calculation and majority determination can be done while the data is being transferred between caches, in other embodiments, such operations may be performed at other points in time before or after such transfer occurs.

At 560 the second page data is stored in the first cache, thereby marking the completion of the second activate operation. Because the second activate operation is complete, the write back of the first page data from the second cache into the array at 570 can occur without interfering with the second activate operation. Note that while in some embodiments, the write-back of the first page data does not occur until the second page data is loaded into the first cache, in other embodiments, the write-back may begin earlier in time at a point where the write-back does not interfere with the ongoing second activate operation. In some embodiments the write-back includes inversion of the bits in the page and setting of an inversion flag to indicate whether or not the page of data is inverted.

Figure 6:
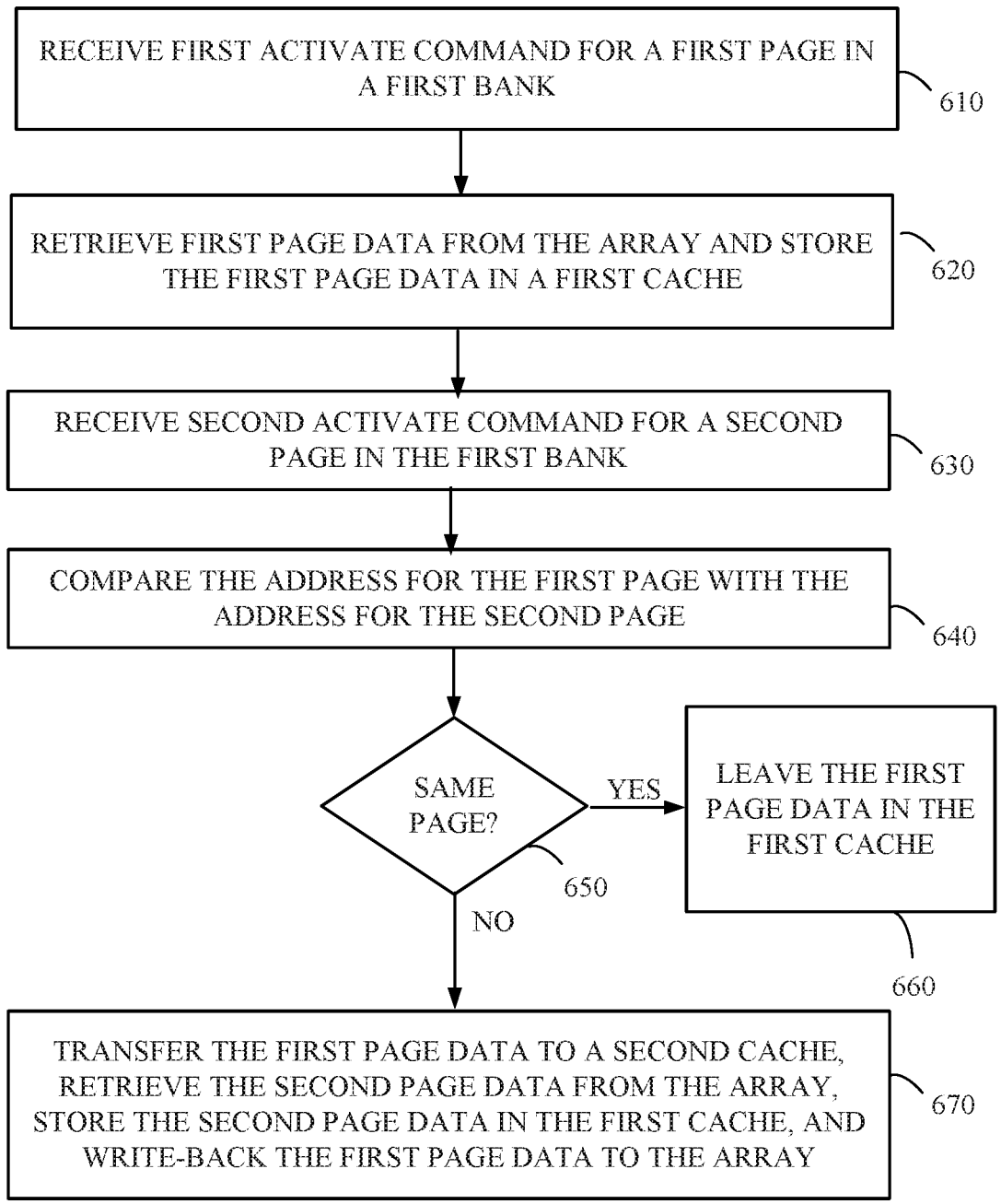

FIG. 6 is a flow chart in which a scenario in which the same page within a bank is activated twice sequentially. At 610 a first activate command for a first page in a first bank is received. At 620, in response to the first activate command, first page data is retrieved from the array and stored in a first cache. As discussed above, the opening of the first page may include setting a flag for the first bank to indicate that a page within that bank is open. Once the first page has been opened, read and write accesses to data in the first page are performed using the first cache. Once those read and write accesses are complete, a precharge command may be received corresponding to the first page, but because delayed write-back operations are being performed in the memory device, the precharge command may not result in the data being shifted from the first cache into a second cache, or written back into the memory array.

At 630, a second activate command for a second page in the first bank is received. Because there is already an open page for the first bank, at 640 the address for the first page is compared with the address for the second page. At 650, if it is determined that the address for the first page matches the address for the second page, the method proceeds to 660 where the first page data is left remaining in the first cache. In addition to leaving the first page data in the first cache, any write-back that would normally occur as a result of the second activate command can also be blocked. Blocking a write-back of the first page data back into the array ensures that if the portion of the array corresponding to the first page data has been left in an intermediate state after the activate command, that intermediate state is preserved such that the eventual write-back of the first page data is not compromised. For example, if the first page data is read from the array using a self-referenced read that leaves all of the memory cells in the page in the array in a "0" or reset state, the write back only requires those memory cells that store a "1" or set state to be written. If the write-back of the first page data were allowed to occur in response to the second activate command even though the data is retained in the first cache, a later write back could require both 0s and 1s to be written back, thereby complicating the later write-back operation.

Thus, while in conventional memory devices, the closing of the first page by a precharge command would have resulted in the data for the first page being stored back in the memory array, embodiments of the delayed write-back described herein result in the first page data remaining in the first cache structure until a subsequent activate operation is initiated. If the second activate operation is to the same page that has already been opened, there is no need to fetch new data to be stored in the first cache. In fact, an attempt to fetch new data from the array would result in garbage data being loaded into the first cache if a self-referenced read is used during the activate operations. As such, if back-to-back accesses to the same page within the same bank occur, the memory device does not have to do any data transfer in order to prepare the first cache for read and write accesses to the first page of data as that data still remains in the cache.

If it is determined at 650 that the same page is not being activated by the second activate command, the method proceeds to perform the operations necessary to facilitate the second activate command. At 670, the first page data is transferred from the first cache to a second cache, which as discussed above, can include parity calculation and majority determination. Also at 670, the second page data is retrieved from the array and stored in the first cache, thereby making the second page data available for read and write accesses using the first cache. Finally, once the activate operation corresponding to the second page has completed, or reached a stage of completion at which the write-back of the first page data would not interfere with the activate, the write-back of the first page data to the array occurs.

Figure 7:
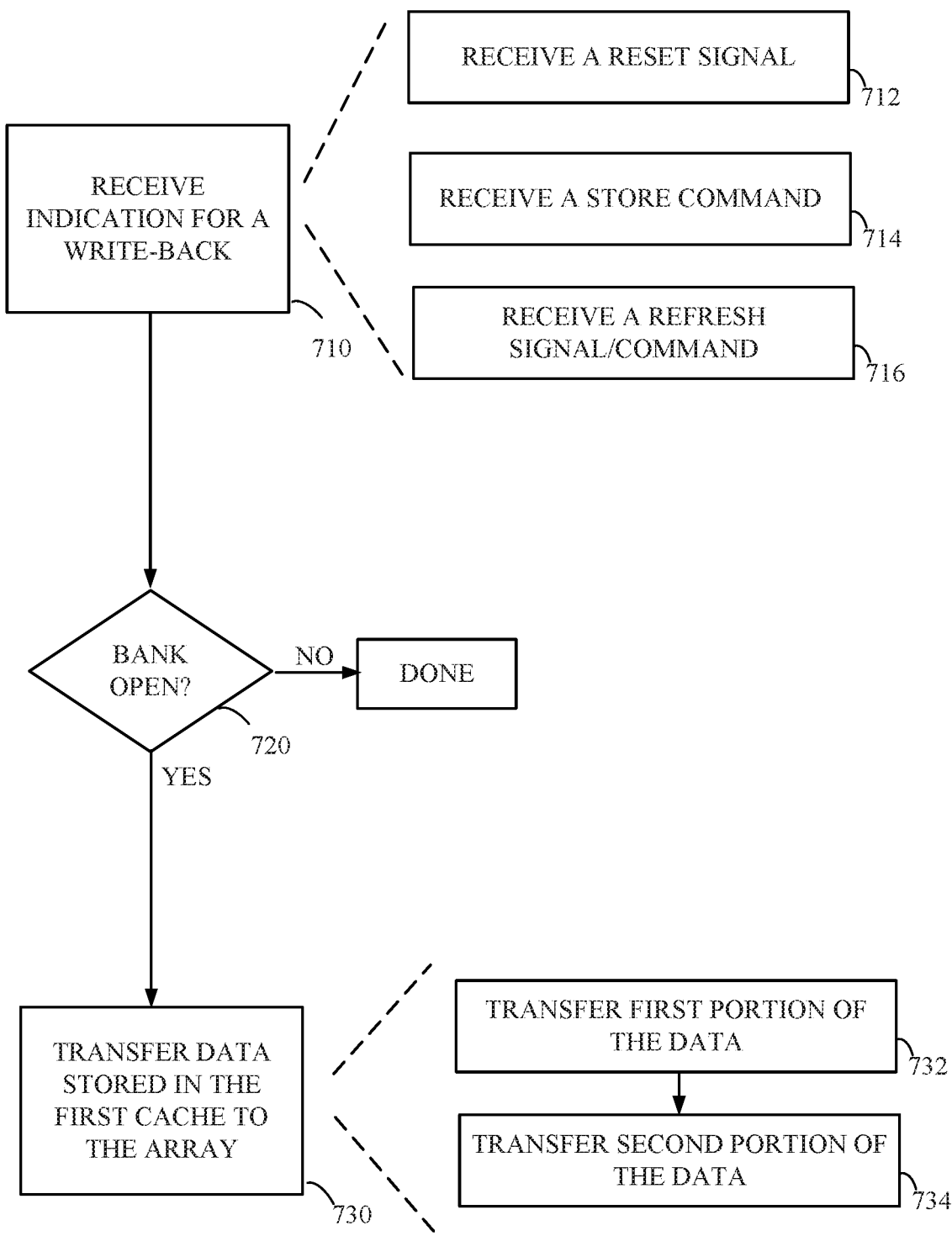

The flow chart of FIG. 7 helps to illustrate the scenario in which a write-back indication is received by the memory device, where the write-back indication informs the memory device that any open pages, or closed pages awaiting a write-back, should be cleaned up such that the data corresponding to those pages is returned to non-volatile memory. Such an indication can be provided periodically to the memory device after stopping activity in order to ensure that data in the memory device is stored in non-volatile storage.

At 710 an indication for a write-back is received. As discussed above with respect to FIG. 4, the indication for a write-back can include receipt of a reset signal at 712, receipt of a store command at 714, or receipt of a refresh signal or command, including entry into a self-refresh mode, at 716. In some embodiments, a write-back indication is automatically provided any time the memory device enters a power-down mode. As also discussed above with respect to FIG. 4, a store command such as that received at 714, can indicate that one or more banks should be acted upon. For example, if the memory device is about to be powered-down, a store command can be received that indicates that all banks should be cleaned up so that any memory data currently stored in volatile storage is written back into the non-volatile array.

After receipt of the indication for a write-back at 710, it is determined at 720 whether or not the particular bank to which the indication for a write-back pertains has an open page. If not, no write-back is needed as there is no data corresponding to the bank that is currently in volatile storage. If it is determined at 720 that the bank has an open page, at 730 data stored in the first cache is transferred to the non-volatile array. The transfer at 730 can include either a direct transfer from the first cache to the array, or if the circuitry within the memory device is set up is the data is routed through the second cache on its way to the array, the transfer at 730 includes moving the data from the first cache to the second cache prior to write back from the second cache. The transfer between caches or from one of the caches to the array can include parity calculation and majority determination as discussed above.

When the write back that occurs at 730 involves a large number of memory cells being written to, the write-back can be split into multiple phases. For example, at 732 a first portion of the data is transferred to the array, and then at 734 a second portion of the data is transferred to the array. In a more specific example, a STORE-ALL command may be triggered prior to device shutdown. Such a STORE-ALL command may result in data corresponding to multiple banks being written back into the array. In order to avoid high peak power consumption and large current spikes associated with writing to many memory cells simultaneously, the write-back operations corresponding to a first half of the banks may be performed at 732, whereas the write operations corresponding to a second half of the banks is performed at 734. In other embodiments, a portion of the memory cells in each bank are written during each of steps 732 and 734 such that the write-back operations within each bank are staggered in time.

Figure 9:
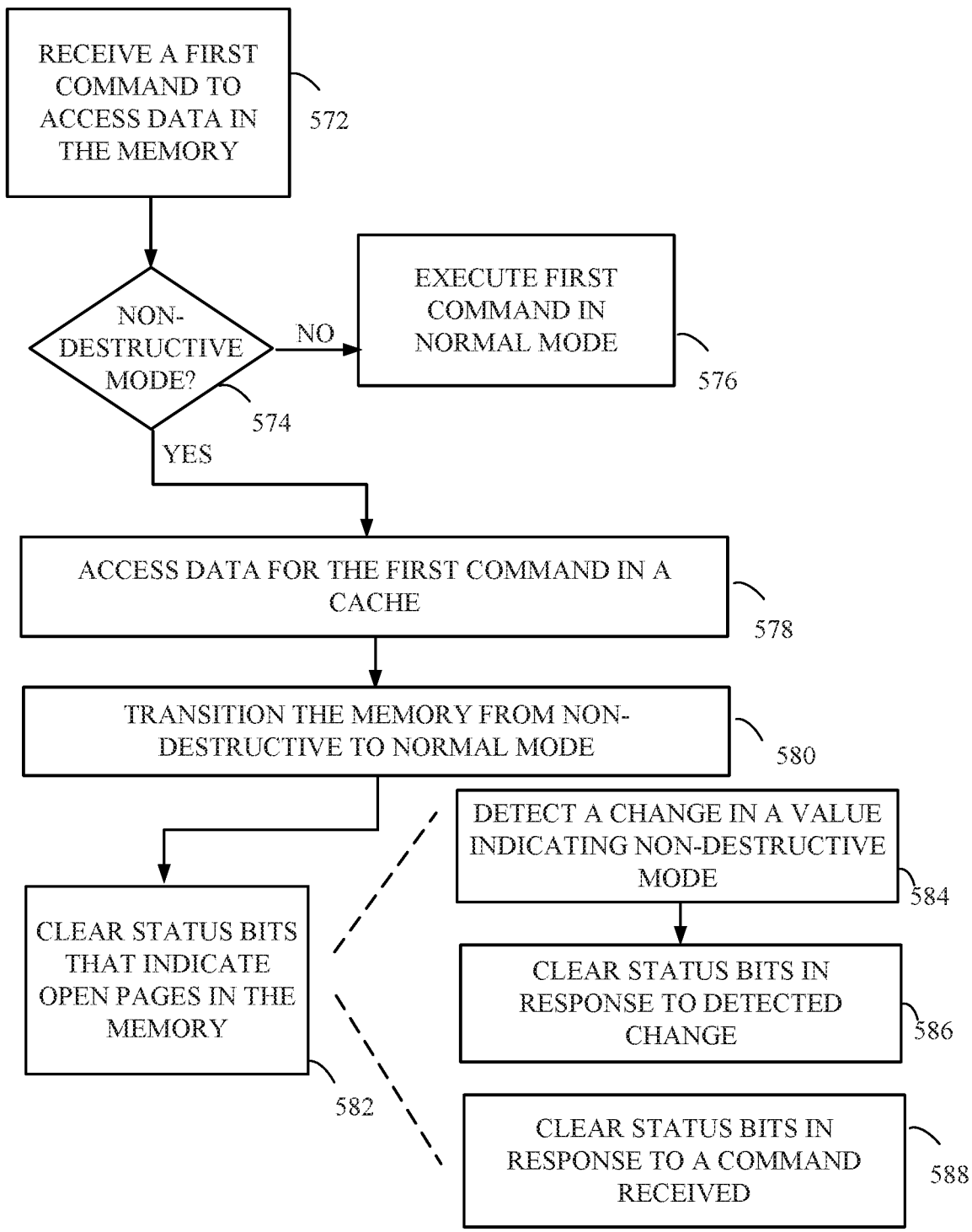
FIGS. 9 and 10 are flow charts corresponding to methods for performing and supporting non-destructive calibration in memories supporting delayed write-back in accordance with exemplary embodiments.

FIG. 9 provides a flow chart corresponding to the operation of a memory device in which delayed write-back is supported and configuration testing or calibration is performed. Such calibration or testing typically occurs at startup. At 572, a first command to access data in memory is received. In response to the first command, the memory determines at 574 whether or not it is in a non-destructive mode of operation in which data stored in the non-volatile memory cells of the array are protected and not to be disturbed. If it is determined at 574 that the memory is not in the non-destructive mode of operation, then the first command is executed in normal mode at 576. After executing the first command in normal mode at 576, the memory can continue normal operation based on commands received.

If it is determined at 574 that the memory is in non-destructive mode, then the data corresponding to the first command is accessed at 578 in a cache or other storage location on the memory that is not expected to be non-volatile with respect to data storage. Such a data access can include reading and writing to the storage location, where a series of such write/read operations can be performed in order to sweep a range of timing parameters for certain signals to determine a preferred setting for such parameters. Thus, while the memory is in non-destructive mode, commands associated with data accesses that, if the memory were in normal mode would result in data being modified in the non-volatile memory cells, are executed using other storage on the memory so that the non-volatile storage is left undisturbed. For example, the read and write operations associated with calibrating the data strobes or other timing parameters in a DDR interface can be performed using an on-memory cache instead of the memory array itself, thereby allowing the timing configuration for the memory device to be established without corrupting any of the non-volatile data stored therein.

At 580 the memory is transitioned from non-destructive mode to normal mode. Such a transition can be in response to information received by the memory device or based on an internal determination that a calibration procedure or other operation that benefits from the non-destructive mode is complete. In one example, the memory includes a register that stores a value that indicates whether the memory is in the non-destructive mode. If the memory receives a command or other signal that modifies the value in the register, such a change in the value can transition the memory from the non-destructive mode to the normal mode.

In some embodiments, the flags or status bits that keep track of whether there is an open row for a particular bank are disabled during the non-destructive mode. In other words, just as the non-volatile memory cells are prevented from being overwritten in the non-destructive mode, the storage used to store the flags or status bits can be prevented from being modified. In such embodiments, when exiting the non-destructive mode, because the flags or status bits are clear, there is no concern that an incorrect indication of an open row will cause a delayed write-back operation that could corrupt non-volatile data after the memory transitions to normal mode.

In other embodiments, the flags or status bits, which may be set to indicate open pages of memory during the execution of commands while the memory is in the non-destructive mode, are cleared at 582 before responding to data access commands in the normal mode. In some embodiments, the flags or status bits are cleared prior to the transition to normal mode, whereas in other embodiments, the flags or status bits are cleared after entering normal mode.

As shown at 584 and 586, clearing the status bits can be based on detecting a change in a value indicating whether the memory is in the non-destructive mode and then clearing the status bits based on the change detected. As discussed above, the change in the value on the memory can correspond to a change in a value in a mode register, where the change in value indicates a transition from the non-destructive mode to the normal mode for the memory. Such a register can be modified, for example, by a mode register set command issued by a memory controller. Circuitry on the memory can detect the change of the value in the register and then clear the flags or status bits in response.

In other embodiments, the memory clears the status bits in response to a command received by the memory. In some cases, the command is a refresh, self-refresh, reset, or precharge command received before the memory exits the non-destructive mode. As such, even though those commands would potentially cause a delayed-write back to occur, if the memory is still in the non-destructive mode, the non-volatile data will be protected. In other embodiments, a command that specifically clears the flags or status bits is received by the memory device, where such a command can be received either before or after the transition from non-destructive mode to normal mode as no delayed write-back is motived by such a command that clears the status bits.

Once the memory device has entered the normal mode and has cleared the flags or status bits, then normal operation can proceed without concern for an unintended delayed write-back operation that could overwrite the data in the non-volatile storage with garbage data from one of the cache structures left over from calibration operations.

Figure 10:
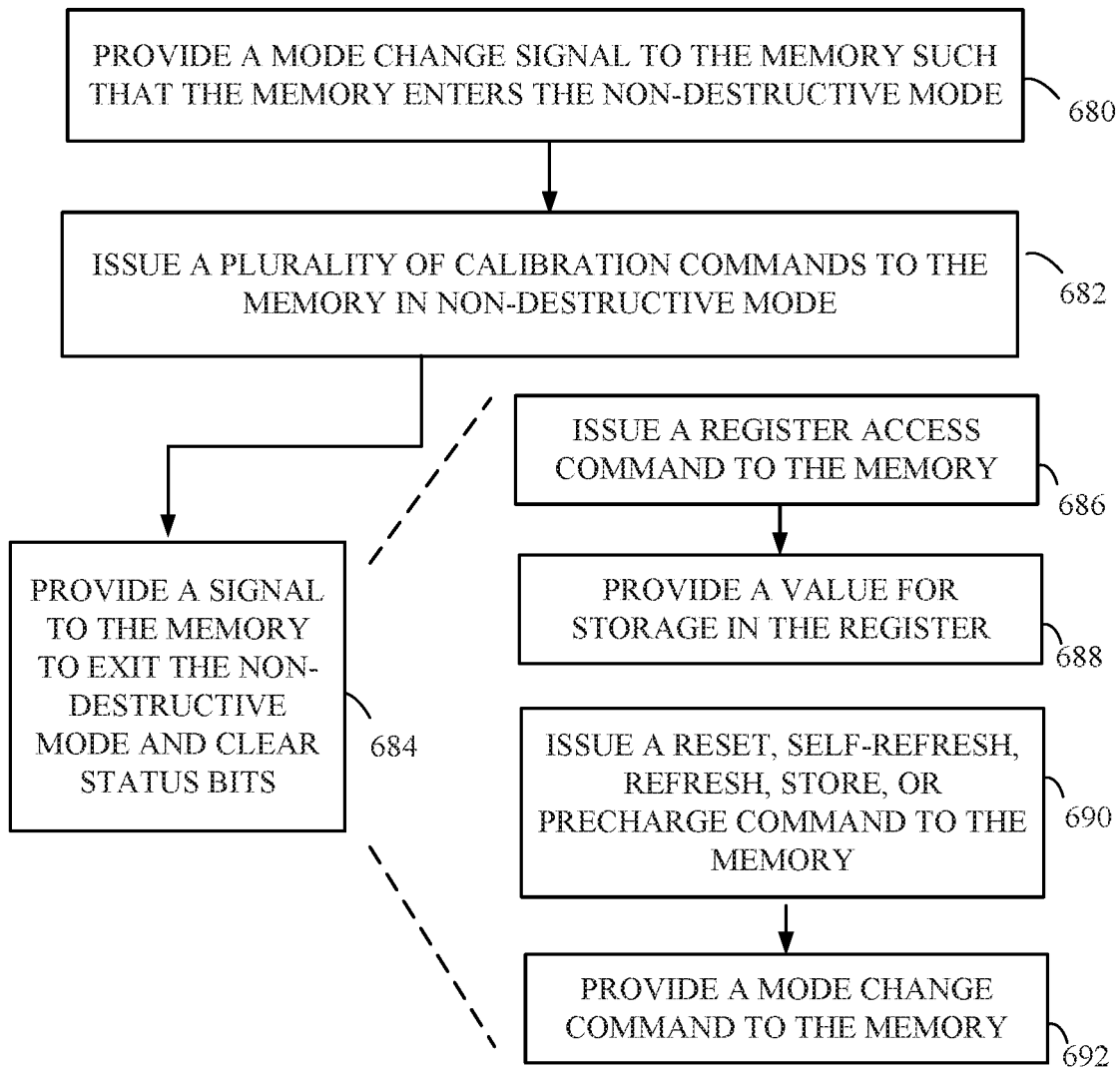

FIG. 10 illustrates a flow chart of a method for controlling a memory, which, for example, can be performed by a memory controller or other external entity that directs the operations of a memory. At 680, a mode change signal is provided to the memory such that the memory enters the non-destructive mode of operation in which the data stored in the non-volatile memory array is protected from being overwritten. In some embodiments, the mode change signal corresponds to a mode register write that stores a value on the memory that selects the non-destructive mode. In other embodiments, a dedicated signal or sequence of signal transitions are used to provide the mode change signal. In yet other embodiments, the memory defaults to the non-destructive mode of operation on power-up, thereby eliminating the need to provide the mode change signal to the memory.

At 682 a plurality of calibration commands are issued to the memory device while the memory device is in the non-destructive mode. In some examples, the calibration commands are read and write commands associated with calibrating one or more signals used for communication between the memory controller and memory. For example, the calibration commands can involve a series of write and read commands that use slightly different timing for the data strobe (e.g. DQS) signal in order to determine the optimal timing for such a signal. From the perspective of the memory controller, the calibration commands may be no different from the commands used during normal operation (activate, read, write, precharge, etc. . . . ), whereas from the perspective of the memory, the commands are executed in a manner that does not disturb the non-volatile memory array on the memory. As discussed above, the memory preferably includes additional storage such as one or more caches or volatile memory blocks that enable the read and write operations to be supported during calibration or testing without the need to disturb the non-volatile array.

At 684, after issuing the plurality of calibration commands to the memory, the memory controller provides a signal to the memory that causes the memory to exit the non-destructive mode and clear any flags or status bits that indicate that there are open pages on the memory. By clearing the flags or status bits, the memory controller can ensure that no inadvertent write-back operations that would corrupt non-volatile data result from the calibration or testing procedures performed during the time the memory is in the non-destructive mode. As discussed above, the memory can transition to the normal mode and clear the flags or status bits in response to the memory controller issuing a register access command to the memory at 686 and providing a value for storage in a register on the memory device at 688. The value, when stored on the memory, causes the memory to transition from the non-destructive mode to the normal mode. In other embodiments, the flags or status bits are cleared by issuing a reset, self-refresh, refresh, store, or precharge command to the memory at 690 before the memory transitions from the non-destructive mode to the normal mode. After issuing such a command, a mode change command can be provided to the memory at 692, where the mode change command transitions the memory to the normal state after the flags or status bits have been cleared, where those flags or status bit are used to indicate one or more open pages. In yet other embodiments, the memory controller signals the memory to change to the normal mode, or waits for the memory to automatically transition from the non-destructive mode to the normal mode based on completion of the calibration or testing operations, and then sends a command or signal to the memory that directs the memory to clear any flags or status bits corresponding to open pages before beginning operations in normal mode in which delayed write-back operations are employed.

Figure 8:
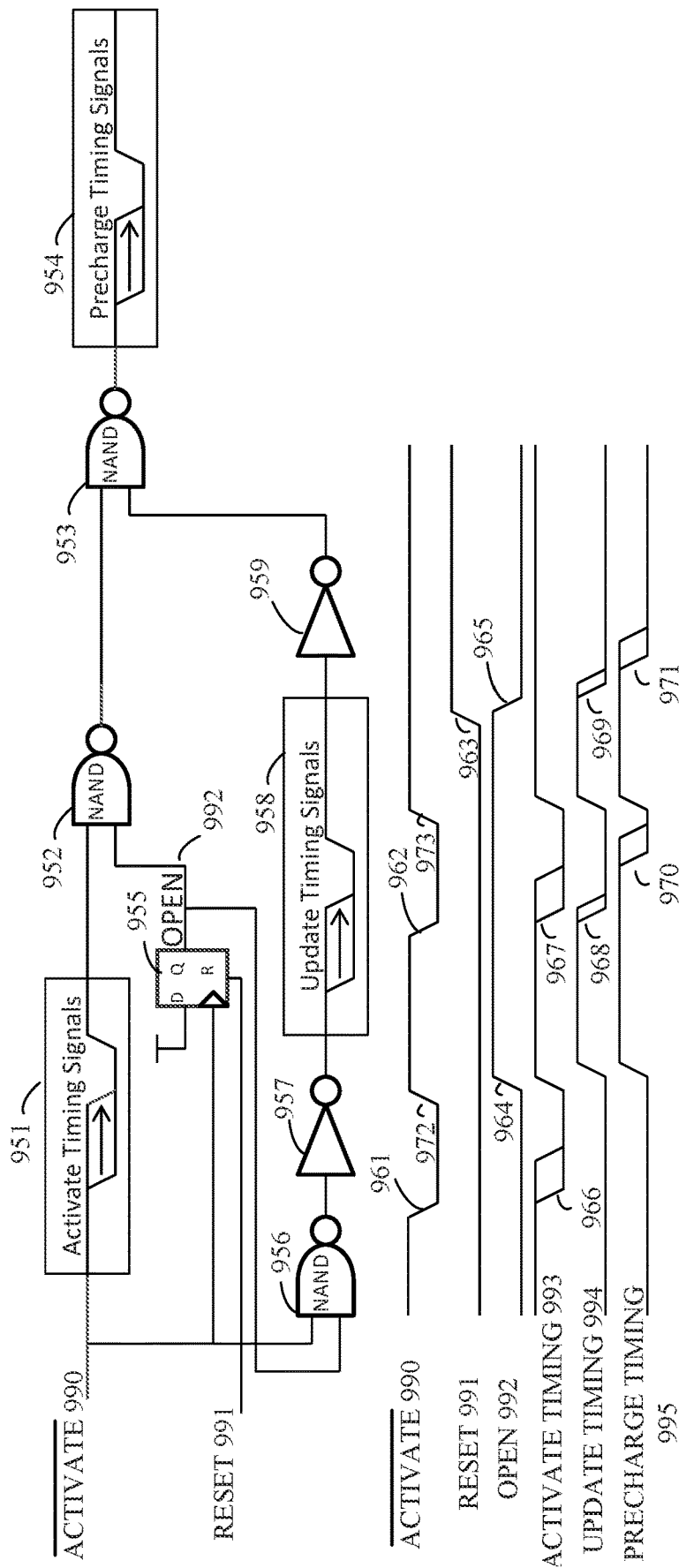
FIG. 8 is a schematic diagram of a portion of a magnetic memory device with an associated timing diagram in accordance with another exemplary embodiment.

FIG. 8 illustrates a circuit diagram associated with a portion of the memory device that includes the use of delayed write-back operations. The timing diagram below the schematic helps to illustrate the functionality of the circuitry. Upon startup, the OPEN signal 992 is low, thereby indicating that no pages in the bank have been opened and thus are awaiting write-back with the next activate. When the /ACTIVATE signal 990 is asserted low for the first time at edge 961, the ACTIVATE TIMING signals 993 are shown to transition from high to low at 966, which represents the generation of the numerous timing signals used in an activate operation. In the embodiment of FIG. 8, these signals are signal transitions directly resulting from the high-to-low transition of the /ACTIVATE signal 990 and are generated by activate timing circuits block 951.

When the /ACTIVATE signal 990 returns high at edge 972 in the timing diagram, the OPEN signal 992, which is the output of flip-flop 955, goes high. The OPEN signal 992 is used to determine that a page has been opened and a write-back for that page should be triggered upon receipt of a subsequent activate assertion. The ACTIVATE TIMING signals 993, UPDATE TIMING signals 994, and WRITE-BACK TIMING signals 995 all go from low to high when the /ACTIVATE signal 990 is deasserted high at 973 with the OPEN signal 992 high. This occurs based on logic gates 952, 953, 956, 957, and 959 and prepares those sets of timing signals for subsequent assertion when the next activate signal assertion occurs. The signals are prepared for assertion as it is known that the next activate will result in an activate of the new page, an update of the parity/majority of the previous page, and a write-back of the previous page.

When next assertion of /ACTIVATE 990 occurs at edge 962, that assertion triggers the assertion of each of the ACTIVATE TIMING signals 993, UPDATE TIMING signals 994, and WRITEBACK TIMING signals 995. Thus, the timing signals to activate the new page are generated by activate timing circuits block 951 (edges 967), the timing signals to update the parity and majority information regarding the previously opened page are generated by update timing circuits block 958 (edges 968), and, after the update and the activate are complete, the signals used to write-back the previously opened page (WRITEBACK TIMING signals 995) are generated by the writeback timing circuits block 954 (edges 970). Upon deassertion of /ACTIVATE 990 at edge 973, each of the timing signal groups of signals is deasserted in preparation for the next activate. The OPEN signal 992 remains high.

When the RESET signal 991 is pulled high at edge 963, this indicates that any data stored in volatile memory should be written back into the array. In other embodiments, the receipt of a refresh command or STORE command can also trigger such a write-back. The assertion of RESET resets flip-flop 955, causing the OPEN signal 992 to go low at edge 965. The transition of the OPEN signal 992 propagates through the circuit, causing the UPDATE TIMING signals 994 to be asserted (edges 969) as well as the WRITEBACK TIMING signals 995 to be asserted (edges 971). As a result, the timing signals that cause the previously opened page to updated (parity calculation and majority determination) and written back into the memory array.

By delaying the write-back of an open page of data for a bank until a subsequent activate operation is completed, the delay associated with writing the data back to the array can be hidden, thereby improving the access timing associated with the device. This is because the memory does not have to wait for the write-back to occur before activating the next page, thereby allowing read/write operations for the newly opened page to occur while the write-back operation is performed in the background. Such simultaneous performance of read/writes and the write-back of data to the array provides a significant timing advantage. Including a new operation code to support data write-back without the need for another activate operation helps to ensure that data is not left in non-volatile storage when power-down occurs. In some instances multiple pages of data may be written back into the array based on a single write-back indication, and the data write-back can be staggered to reduce peak power consumption.

While exemplary embodiments have been presented above, it should be appreciated that many variations exist. Furthermore, while the description uses spin-torque MRAM devices that include memory cells in a specific example arrangements, the teachings may be applied to other memory devices having different architectures in which the same concepts can be applied. Examples of such memory devices include other resistive memories and DRAMs. Such memories would benefit in terms of improved random access time, reduced power consumption, and increased data retention time.

The particular embodiments disclosed above are illustrative only and should not be taken as limitations, as the embodiments may be modified and practiced in different but equivalent manners apparent to those skilled in the art having the benefit of the teachings herein. Accordingly, the foregoing description is not intended to limit the disclosure to the particular form set forth, but on the contrary, is intended to cover such alternatives, modifications and equivalents as may be included within the spirit and scope of the inventions as defined by the appended claims so that those skilled in the art should understand that they can make various changes, substitutions and alterations without departing from the spirit and scope of the inventions in their broadest form.

What is claimed is:

1. A memory, comprising:
   an array of non-volatile memory cells;
   a register that stores a value, wherein the value determines that the memory is in one of a normal operation mode and a non-destructive operation mode;
   a status bit indicating whether a page in the array of non-volatile memory cells is open; and
   control circuitry coupled to the array of non-volatile memory cells and the register, wherein the control circuitry is configured to:
      prevent write operations to the array of non-volatile memory cells when the memory is in the non-destructive operation mode;
      receive an indication that the memory is transitioning from the non-destructive operation mode to the normal operation mode; and
      in response to the indication that the memory is transitioning from the non-destructive operation mode to the normal operation mode, clear the status bit, wherein the indication is a change in the value of the register.

2. The memory of claim 1, wherein the memory further comprises mode change detection circuitry coupled to the register and the control circuitry, wherein the mode change detection circuitry provides the indication that the memory is transitioning from the non-destructive mode to the normal mode.

3. The memory of claim 1, wherein the status bit is cleared independent of whether a page in the array of non-volatile memory cells is closed.

4. The memory of claim 1, wherein the register is a mode register.

5. The memory of claim 1, wherein the register defaults to a value corresponding to the non-destructive operation mode.

6. The memory of claim 5, wherein the memory exits the non-destructive operation mode automatically on completion of a calibration procedure.

7. The memory of claim 1, further comprising:
a first cache coupled to the array and the control circuitry;
a second cache coupled to the array and the control circuitry; and
wherein the control circuitry is further configured to:
in response to a first activate command corresponding to a first page:
transfer first page data from a first location in the array to the first cache, wherein the first page data corresponds to the first page; and
set the status bit to indicate that there is an open page;
transfer the first page data from the first cache to the second cache; and
after transferring the first page data to the second cache and in response to a second activate command:
transfer second page data from a second location in the array to the first cache; and
transfer the first page data from the second cache to the first location in the array.

8. The memory of claim 1, wherein the control circuitry is configured to prevent write operations to the array of non-volatile memory cells when the memory is in the non-destructive operation mode such that preventing write operations includes preventing write operations that place each of the memory cells in a page into a known state as a part of a self-referenced read operation.

9. A method for operation of a memory that includes a non-volatile memory array and a first cache, the method comprising:
receiving a first command to access data in the memory;
in response to receiving the first command:
determining that the memory is in a non-destructive mode, wherein in the non-destructive mode, data stored in the non-volatile memory array is not disturbed; and
accessing data in the first cache;
after accessing the data in the first cache, transitioning the memory from the non-destructive mode to normal mode; and
in response to a change in a value stored in a register, the change indicating that the memory is transitioning from the non-destructive mode to the normal mode, clearing status bits indicating open pages in the memory.

10. The method of claim 9, wherein the change in the value stored in the register is provided by a mode change detection circuitry.

11. The method of claim 9, wherein the status bits are cleared independent of whether a page in the memory is closed.

12. The method of claim 9, wherein the memory exits the non-destructive mode automatically on completion of a calibration procedure.

13. The method of claim 9, further comprising, after transitioning the memory from the non-destructive mode to the normal mode:
receiving a first activate command and a first address corresponding to a first page within the memory;
in response to the first activate command:
retrieving first page data corresponding to the first page from the array of memory cells based on the first address;
storing the first page data in the first cache; and
setting at least one of the status bits to indicate that there is an open page;
transferring the first page data from the first cache to a second cache on the memory;
after receiving the first activate command, receiving a second activate command and a second address corresponding to a second page within the memory;
in response to the second activate command:
retrieving second page data corresponding to the second page from the array of memory cells based on the second address; and
storing the second page data in the first cache; and
writing the first page data from the second cache into the array of memory cells at a location corresponding to the first address.

14. A method for controlling a memory, comprising:
issuing a plurality of calibration commands to the memory, wherein the plurality of calibration commands correspond to a calibration sequence executed while the memory is in a non-destructive mode; and
after issuing the plurality of calibration commands, providing at least one signal to the memory, wherein providing at least one signal to the memory comprises:
issuing a register access command to the memory; and
providing a value to the memory for storage in the register, wherein, when stored in the register, the value causes the memory to transition from the non-destructive mode to the normal mode, and
wherein in response to the value being stored in the register, the memory:
transitions from the non-destructive mode to a normal mode; and
clears status bits on the memory indicating open pages in the memory.

15. The method of claim 14, wherein the status bits are cleared independent of whether a page in the memory is closed.

16. The method of claim 14, wherein the memory exits the non-destructive mode automatically on completion of a calibration procedure.

17. The method of claim 14 further comprising:
before issuing the plurality of calibration commands to the memory, providing a mode change signal to the memory, wherein the memory enters the non-destructive mode in response to the mode change signal.

* * * * *